(12) United States Patent
Bailey, III et al.

(10) Patent No.: US 8,017,516 B2
(45) Date of Patent: *Sep. 13, 2011

(54) METHOD FOR STRESS FREE CONDUCTOR REMOVAL

(75) Inventors: Andrew D. Bailey, III, Pleasanton, CA (US); Shrikant P. Lohokare, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 378 days.

This patent is subject to a terminal disclaimer.

(21) Appl. No.: 11/732,608

(22) Filed: Apr. 3, 2007

(65) Prior Publication Data

US 2007/0190771 A1    Aug. 16, 2007

Related U.S. Application Data

(60) Division of application No. 10/769,522, filed on Jan. 30, 2004, now Pat. No. 7,217,649, which is a continuation-in-part of application No. 10/390,117, filed on Mar. 14, 2003, now Pat. No. 6,939,796, and a continuation-in-part of application No. 10/390,520, filed on Mar. 14, 2003, now Pat. No. 6,821,899.

(51) Int. Cl.
   *H01L 21/4763* (2006.01)

(52) U.S. Cl. ........ 438/622; 438/626; 438/631; 438/692; 257/E21.3; 257/E21.304; 257/E21.579

(58) Field of Classification Search .................. 438/626, 438/631, 690–692, 699, 703, 694–695, 622–624, 438/633, 780–782; 257/E21.3, E21.304, 257/E21.579

See application file for complete search history.

(56) References Cited

U.S. PATENT DOCUMENTS

| | | | | |
|---|---|---|---|---|
| 6,028,360 A | * | 2/2000 | Nakamura et al. | 257/758 |
| 6,440,840 B1 | * | 8/2002 | Chen | 438/624 |
| 6,653,224 B1 | * | 11/2003 | Gotkis et al. | 438/627 |
| 6,696,337 B2 | * | 2/2004 | Asano et al. | 438/253 |
| 6,696,358 B2 | * | 2/2004 | Mukherjee et al. | 438/622 |
| 2005/0164489 A1 | * | 7/2005 | Kloster et al. | 438/622 |

* cited by examiner

*Primary Examiner* — Samuel A Gebremariam
(74) *Attorney, Agent, or Firm* — Martine Penilla & Gencarella, LLP

(57) ABSTRACT

A system and method for forming a planar dielectric layer includes identifying a non-planarity in the dielectric layer, forming one or more additional dielectric layers over the dielectric layer and planarizing at least one of the additional dielectric layers wherein the one or more additional dielectric layers include at least one of a spin-on-glass layer and at least one of a low-k dielectric material layer and wherein each one of the one or more additional dielectric layers having a thickness of less than about 1000 angstroms and wherein the one or more additional dielectric layers has a total thickness of between about 1000 and about 4000 angstroms.

13 Claims, 16 Drawing Sheets

METHOD FOR STRESS FREE CONDUCTOR REMOVAL

CROSS REFERENCE TO RELATED APPLICATIONS

This application is a divisional of and claims priority from and incorporates in its entirety U.S. patent application Ser. No. 10/769,522, filed on Jan. 30, 2004 now U.S. Pat. No. 7,217,469 and entitled "System and Method for Stress Free Conductor Removal". The 10/769,522 application is a continuation-in-part of and claims priority from U.S. patent application Ser. No. 10/390,117 filed on Mar. 14, 2003, now U.S. Pat. No. 6,939,796, and entitled "System, Method and Apparatus For Improved Global Dual-Damascene Planarization," which is incorporated herein by reference in its entirety. The 10/769,522 application is also a continuation-in-part of and claims priority from U.S. patent application Ser. No. 10/390,520 filed on Mar. 14, 2003, now U.S. Pat. No. 6,821,899, and entitled "System, Method and Apparatus For Improved Local Dual-Damascene Planarization," which is incorporated herein by reference in its entirety.

BACKGROUND OF THE INVENTION

1. Field of the Invention

The present invention relates generally to dual damascene semiconductor manufacturing processes, and more particularly, to methods and systems for planarizing features and layers in a semiconductor manufacturing process.

2. Description of the Related Art

Single and dual damascene manufacturing processes are becoming more common in semiconductor manufacturing. In a typical damascene manufacturing process, one or more conductive materials are deposited in previously patterned trenches and vias formed in a semiconductor substrate or films formed on the semiconductor substrate to form the desired electrical circuit interconnects. An excess or overburden portion of the conductive material is often formed. The overburden portion of the conductive material is unnecessary and undesirable and must be removed both to produce a damascene feature and to provide a planar surface for subsequent processing.

The overburden portion of the conductive material is typically removed from the semiconductor substrate through chemical mechanical polishing (CMP) and electro-chemical polishing (ECP) (e.g., etching) processes and combinations of CMP and ECP processes. Each of these processes has significant shortfalls. By way of example, ECP typically has a relatively low throughput, poor uniformity and inability to effectively remove non-conductive material.

CMP requires physical contact processes which typically leave conductive residues, or cause corrosion of the various materials, or result in non-uniform removal, and the inability to suitably planarize interconnect and interlevel dielectric (ILD) top surface. CMP can also cause stress related damage (e.g., interlayer delamination, peeling) to remaining interconnect and ILD structures. The CMP-caused stress damage is further exacerbated by the very poor inter-layer adhesion characteristics of the more-recently used materials. Reducing the physical force of the CMP process to reduce the physical stress can often result in unacceptably low throughput rates and other poor process performance parameters. CMP can also cause excessive erosion of ILD typically varying with feature dimensions and density.

In view of the foregoing, there is a need for an improved planarizing system and method to uniformly and substantially remove overburden material while minimizing physical stress to the remaining features. The improved planarizing system and method should be suitable for use in semiconductor manufacturing and should be applicable to processes such as a damascene process or other semiconductor manufacturing processes.

SUMMARY OF THE INVENTION

Broadly speaking, the present invention fills these needs by providing an improved system and method for forming a semiconductor in a dual damascene structure. It should be appreciated that the present invention can be implemented in numerous ways, including as a process, an apparatus, a system, computer readable media, or a device. Several inventive embodiments of the present invention are described below.

One embodiment provides a method for forming a semiconductor in a dual damascene structure including receiving a patterned semiconductor substrate. The semiconductor substrate having a first conductive interconnect material filling multiple features in the pattern. The first conductive interconnect material having an overburden portion. The over burden portion is planarized. The over burden portion is substantially entirely removed in the planarizing process. A mask layer is reduced and a subsequent dielectric layer is formed on the planarized over burden portion. A mask is formed on the subsequent dielectric layer. One or more features are formed in the subsequent dielectric layer and the features are filled with a second conductive interconnect material.

Planarizing the over burden portion can include a low down force CMP process. Planarizing the over burden portion can include a stress-free planarization process.

The mask layer includes two or more mask layers. Reducing the mask layer can include removing at least a portion of on of the two or more mask layers. Reducing the mask layer can include removing at least one of the two or more mask layers. At least one of the two or more mask layers can include a conductive material.

Reducing the mask layer can include removing the mask layer. Reducing the mask layer can include removing a portion of the first conductive fill material substantially level with a remaining portion of the mask layer. Reducing the mask layer can include etching the mask layer.

Forming the subsequent dielectric layer on the planarized over burden portion can include applying one or more subsequent dielectric layers. The subsequent dielectric layer can include a low-k dielectric material.

Forming the subsequent dielectric layer on the planarized over burden portion can include planarizing the subsequent dielectric layer. Planarizing the subsequent dielectric layer can include identifying a non-planarity in the subsequent dielectric layer, forming second dielectric layer over the subsequent dielectric layer, and planarizing the second dielectric layer. The second dielectric layer can be a substantially planar material. The second dielectric layer can be a spin-on-glass. The subsequent dielectric layer can be a low-k dielectric material.

Another embodiment provides a method for forming a semiconductor in a dual damascene structure including receiving a patterned semiconductor substrate. The patterned semiconductor substrate having a first conductive interconnect material filling multiple features in the pattern. The first conductive interconnect material having an overburden portion. The over burden portion is planarized. The over burden portion being substantially entirely removed in the planarizing process. A mask layer is removed. A subsequent dielectric layer is formed on the planarized over burden portion. A mask is formed on the subsequent dielectric layer. One or more features are formed in the subsequent dielectric layer and the one or more features are filled with a second conductive interconnect material. Removing the mask layer can include etching the mask layer.

Another embodiment provides a method for forming a semiconductor in a dual damascene structure including receiving a patterned semiconductor substrate. The patterned semiconductor substrate having a first conductive interconnect material filling multiple features in the pattern. The first conductive interconnect material having an overburden portion. The over burden portion is planarized where the over burden portion is substantially entirely removed in the planarizing process. A mask layer is reduced and a subsequent dielectric layer is formed on the planarized over burden portion. Forming the subsequent dielectric layer can include identifying a non-planarity in the subsequent dielectric layer, forming second dielectric layer over the subsequent dielectric layer, and planarizing the second dielectric layer. A mask is formed on the subsequent dielectric layer. One or more features are formed in the subsequent dielectric layer. The one or more features are filled with a second conductive interconnect material. Planarizing the second dielectric layer can include etching the second dielectric layer.

The present invention provides the advantage of improved planarity, more accurate mask application. Further, the overall k value of the dielectric stack can be reduced by substantially eliminating non-low-k dielectric materials from the dielectric stack.

Still another embodiment provides a method for forming a semiconductor in a dual damascene structure. The method includes receiving a patterned semiconductor substrate having a first conductive interconnect material filling multiple features in the pattern. The first conductive interconnect material includes an overburden portion. The overburden portion is planarized without imparting stress to the features in the pattern. A subsequent dielectric layer is formed on the planarized overburden portion. The subsequent dielectric layer is planarized including identifying a non-planarity in the subsequent dielectric layer, forming one or more additional dielectric layers over the subsequent dielectric layer and planarizing at least one of the additional dielectric layers. A mask is formed on the planar subsequent dielectric layer, one or more are formed features in the planar subsequent dielectric layer and the one or more features are filled with a second conductive interconnect material.

Each one of the one or more additional dielectric layers have a thickness of less than about 1000 angstroms. At least one of the one or more additional dielectric layers can be a spin-on-glass layer. At least one of the one or more additional dielectric layers can be a low-k dielectric material layer. The one or more additional dielectric layers can include at least one of a spin-on-glass layer and at least one of a low-k dielectric material layer.

The subsequent dielectric layer has a total thickness of about 4000 angstroms. At least one additional dielectric layers can be a substantially planar material. Planarizing at least one of the additional dielectric layers can include applying a stress free planarization. Planarizing at least one of the additional dielectric layers can include at least one of applying a stress free planarization and applying a low down force CMP.

Yet another embodiment provides a method for forming a semiconductor in a dual damascene structure including receiving a patterned semiconductor substrate, having a first conductive interconnect material filling multiple features in the pattern, the first conductive interconnect material having an overburden portion. The overburden portion is planarized without imparting stress to the features in the pattern, a remaining planar overburden portion having a thickness of between about zero and about 500 angstroms. A subsequent dielectric layer is formed on the planarized overburden portion. The subsequent dielectric layer in planarized including identifying a non-planarity in the subsequent dielectric layer, forming at least one additional dielectric layer over the subsequent dielectric layer. Each one of the one or more additional dielectric layers having a thickness of less than about 1000 angstroms and wherein the one or more additional dielectric layers has a total thickness of between about 1000 and about 4000 angstroms and at least one of the additional dielectric layers is planarized. A mask is formed on the planar subsequent dielectric layer, one or more features are formed in the planar subsequent dielectric layer and the one or more features are filled with a second conductive interconnect material.

At least one of the one or more additional dielectric layers can be a spin-on-glass layer. At least one of the one or more additional dielectric layers can be a low-k dielectric material layer. The one or more additional dielectric layers can include at least one of a spin-on-glass layer and at least one of a low-k dielectric material layer.

Still another embodiment provides a method for forming a planar dielectric layer including identifying a non-planarity in the dielectric layer, forming one or more additional dielectric layers over the dielectric layer and planarizing at least one of the additional dielectric layers wherein the one or more additional dielectric layers include at least one of a spin-on-glass layer and at least one of a low-k dielectric material layer and wherein each one of the one or more additional dielectric layers having a thickness of less than about 1000 angstroms and wherein the one or more additional dielectric layers has a total thickness of between about 1000 and about 4000 angstroms.

Planarizing at least one of the additional dielectric layers can include applying a stress free planarization. Planarizing at least one of the additional dielectric layers can include at least one of: applying a stress free planarization and applying a low down force CMP.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, and like reference numerals designate like structural elements.

DETAILED DESCRIPTION OF THE EXEMPLARY EMBODIMENTS

Several exemplary embodiments for an improved planarizing system and method will now be described. It will be apparent to those skilled in the art that the present invention may be practiced without some or all of the specific details set forth herein.

One embodiment of an improved planarizing system and method provides improved local planarization uniformity across a local portion of a semiconductor substrate. The improved local planarization uniformity substantially eliminates local nonuniformities caused by features in underlying layers and variations in deposition processes. Another embodiment provides improved global planarization uniformity across the entire substrate (e.g., edge uniformity as compared to center uniformity).

Figure 1:
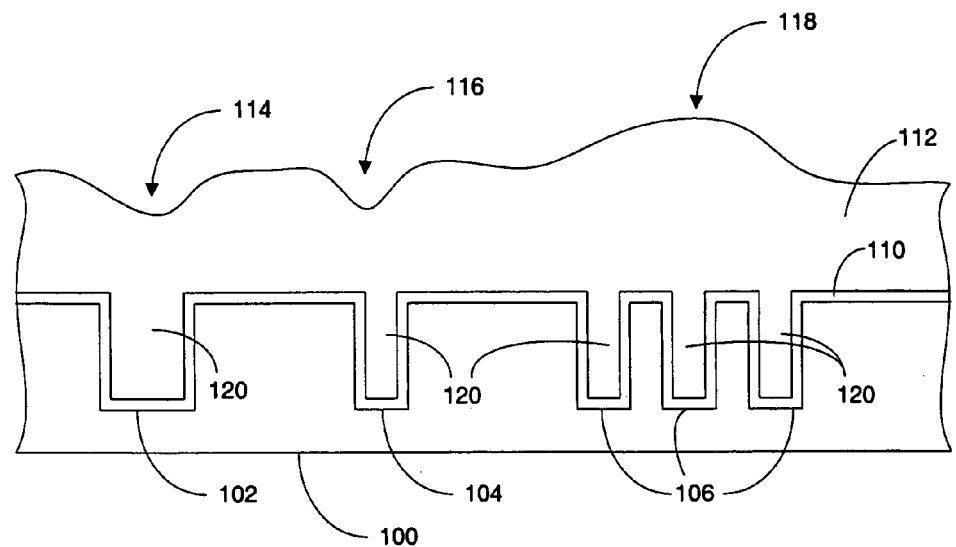
FIG. 1 shows a patterned semiconductor substrate in a dual damascene process in accordance with one embodiment of the present invention.

FIG. 1 shows a patterned semiconductor substrate 100 in a dual damascene process in accordance with one embodiment of the present invention. The substrate 100 has been patterned as part of the semiconductor manufacturing process such as a dual damascene manufacturing process. A mask can be used to pattern the substrate 100. The substrate 100 includes a large, somewhat isolated feature 102 (e.g., trench, via, etc.) a smaller, somewhat isolated feature 104 and several features 106 that are densely packed together. A barrier layer 110 is also included. The barrier layer 110 is typically a different material than the substrate 100 or a conductive interconnect material 120. The conductive interconnect material 120 can be copper or copper alloy or other conductive material.

An overburden portion 112 of the conductive interconnect material 120 extends above the features 102, 104, 106 and includes corresponding localized variations 114, 116, 118 in thickness of the overburden portion 112. As shown, the larger feature 102 has a corresponding larger decrease in the thickness of the overburden portion 112 as compared to the smaller feature 104, which has a slightly smaller variation in thickness of the overburden portion 112. The densely packed features 106 have a somewhat increased thickness of the overburden portion 112.

Typical etch processes etch the overburden portion 112 of the conductive interconnect material 120 at a fairly uniform rate over the entire wafer area and therefore the typical overburden removal process such as a CMP, ECP or etching process will expose the barrier layer 110 near the large feature 102 before the barrier layer 110 near the densely packed features 106 will be exposed. In sum, the typical overburden removal processes cannot planarize the overburden portion 112 of the conductive interconnect material to the precision required for advanced semiconductor device generations.

Figure 2:
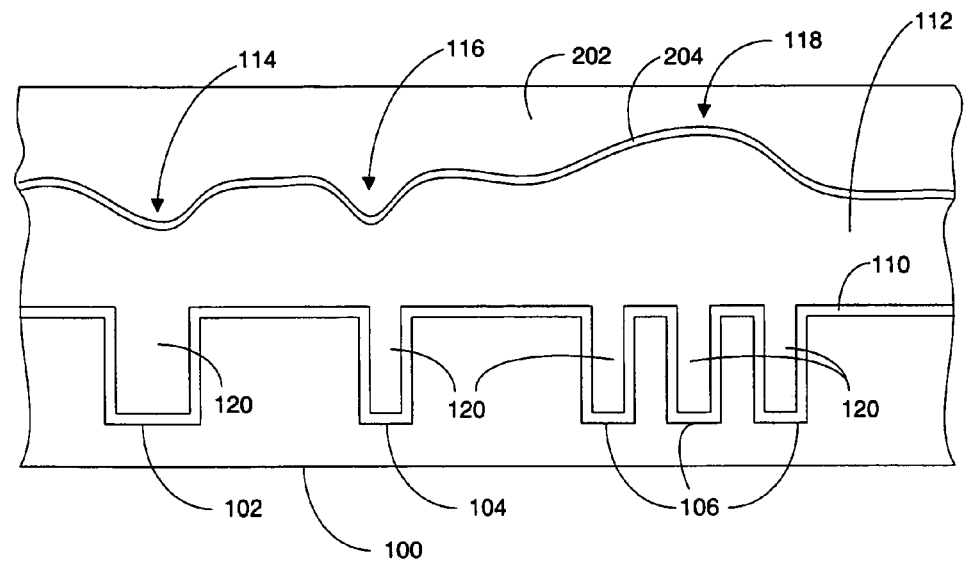
FIG. 2 shows an additional layer added in accordance with one embodiment of the present invention.

FIG. 2 shows an additional layer 202 added in accordance with one embodiment of the present invention. The additional layer 202 is formed on top of the overburden portion 112. The additional layer 202 can be a substantially planar fill material (e.g., spin on glass (SOG), polysilicon, polymer resist, bilayer, UV or thermally curable material, or other material that can flow to form a planar surface and which has the appropriate etching characteristics). An optional, relatively thin (e.g., about 25-100 nm in thickness) conformal layer 204 may also be included between the additional layer 202 and the overburden portion 112. The conformal layer 204 can be a barrier layer or an adhesion layer. The conformal layer 204 can allow a wider variety of materials that can be used for the additional layer 202.

The additional layer 202 and the overburden portion 112 have a substantially 1:1 etch selectivity so that a subsequent etching process (e.g., plasma or gaseous etch process) can etch both the additional layer 202 and the overburden portion 112 at substantially the same rate.

Figure 3:
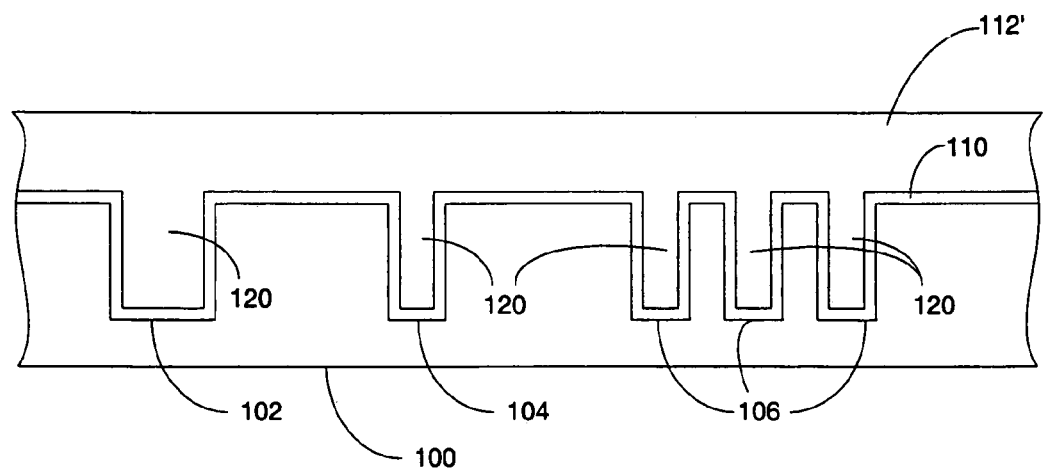
FIG. 3 shows a substantially planar overburden portion in accordance with one embodiment of the present invention.

FIG. 3 shows a substantially planar overburden portion 112' in accordance with one embodiment of the present invention. Because the additional layer 202 forms a substantially planar surface over the stack of layers 100, 110, 112, 202, a first etching process can uniformly etch the additional layer 202 and the overburden 112 over the entire area until the remaining overburden portion 112' is substantially locally planar in that the local variations 114, 116, 118 are substantially eliminated.

A typical recipe would involve conditions that provide a 1:1 etch selectivity between the additional layer 202 and the overburden portion 112. By way of example, if the additional layer 202 is SOG, and the overburden portion 112 is copper, then a halogen (e.g., Cl, F, Br, I) based chemistry provides etch rate control for both the SOG as well as copper to allow for tuning for the desired 1:1 selectivity. Although any plasma feed gas producing reactive halogen radicals can be used, CF4, Cl2, and HCl are typical examples. Various process parameters can be adjusted to control etch rates, selectivity, uniformity and reduce corrosion include variation of process variables such as substrate temperature and inclusion of one or more additives (e.g., Ar, H2, Cl, O2, CH3X (X=F, Cl, Br, I), CH2F2, and CH4).

Another approach involves a sputter dominant etch with Ar or other inert gas such as He, Xe, Ne, Kr, as the primary etchant of the copper overburden portion 112 with other additives to provide etch rate control of the additional layer 202 and passivation of the top surface of the remaining copper 112. The other additives can include, for example H2 and/or CF4. Either of these processes is can operate over a wide temperature range of between about 75 degrees C. and about 400 degrees C.

The first etching process is an etch process designed to leave the remaining overburden portion 112' substantially locally planar in that the local variations 114, 116, 118 are substantially eliminated. One or more subsequent etching processes will remove the bulk or the majority of the overburden portion 112'. A finish etching process can be applied to continue the etching process to an endpoint at which the overburden portion 112' is removed from the barrier 110. The finish etching process can also be included in the bulk etch process. Subsequent processes after the finish etch can include selective barrier removal and passivating the remaining conductive material 120 to prevent corrosion and provide stability for further processing. An additional operation after the finish etch can be designed not to significantly remove any material but only passivate the remaining conductive material 120 to prevent corrosion and provide stability for further processing.

Figure 4A:
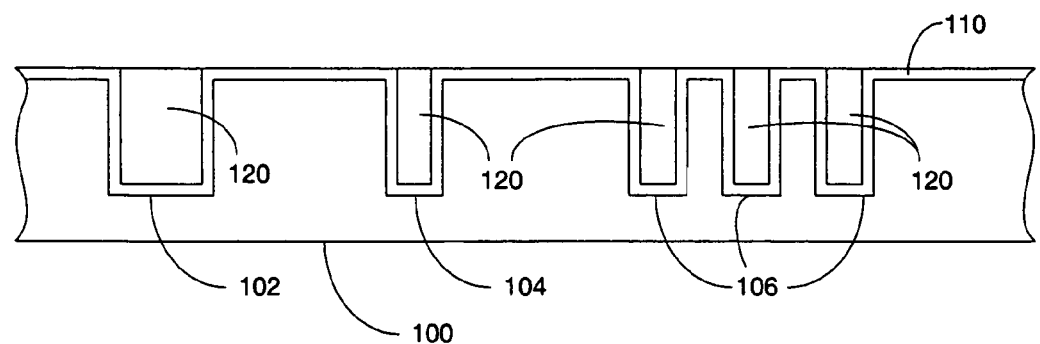
FIG. 4A shows the substrate having undergone a second etching process in accordance with one embodiment of the present invention.

FIG. 4A shows the substrate 100 having undergone a second etching process in accordance with one embodiment of the present invention. The second etching process continues to an endpoint such that the barrier layer 110 will be exposed at all locations substantially simultaneously and leaving only the portion 120 of the conductive material (e.g., copper, copper-containing alloys and combinations, and other conductive material) that fills the features 102, 104, 106.

The first etching process and the second etching process can be substantially similar or significantly different. By way of example, the first etching process can be an etching process for improving the local planarity of the overburden portion 112 due to local non-uniformities 114, 116, 118 (e.g., caused by feature 102, 104, 106 locations, sizes and concentrations in underlying layers). The entire additional layer 202 and a portion of the overburden portion 112 can be removed in the first etching process. By comparison, the second etching process can be a much more selective etching process that removes the bulk of the remaining, planar overburden 112' to the endpoint (i.e., when the barrier layer 110 is exposed).

Figure 4B:
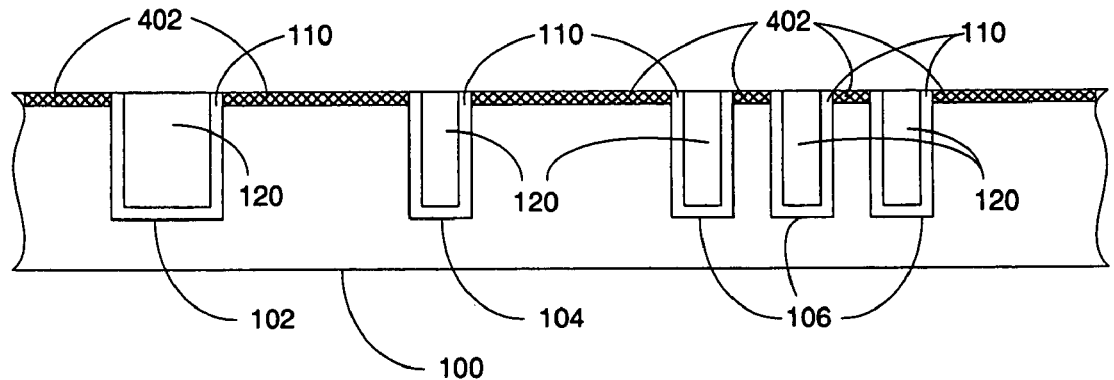
FIG. 4B shows the substrate having undergone a barrier removal process in accordance with one embodiment of the present invention.

FIG. 4B shows the substrate having undergone a barrier removal process in accordance with one embodiment of the present invention. A portion of the barrier layer 110 is removed to expose an underlying mask layer 402. Only the portion of the barrier layer 110 that is formed within the features 102, 104, 106 remain. A typical second etching process removes the bulk portion of the overburden 112 at high rate and preferably with a high selectivity to the barrier layer 110. By way of example, if the overburden portion 112 is copper, a halogen-based chemistry (e.g., Cl2, CF4, HCl, HBr, BCl3) can be effectively used for the second etching process. In another approach a physically dominant etch process such as an Ar (or other noble or inert gas) based sputter process can be used. Various process parameters can be adjusted to control etch rates and selectivity. The various process parameters can include adjusting process variables such as substrate temperature balance of reactive species, and inclusion of one or more additives (e.g., H2, O2, Ar, He, Xe, Ne, Kr, etc.). The barrier removal process can also be incorporated into the second etching process by appropriate selection of chemistry to preferably remove the bulk potion of the overburden 112 and barrier layer 110 with the same rate. Appropriate and independent endpoint signals can be collected to ensure complete removal of the overburden 112 and barrier layer, for example optical emission spectroscopy techniques can be used.

Figure 5:
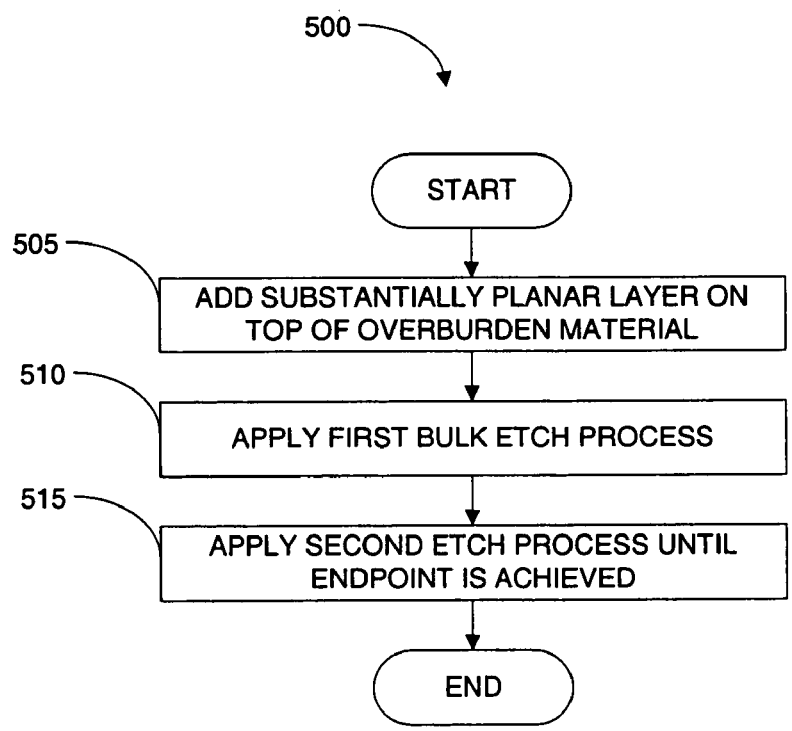
FIG. 5 is a flowchart of the method operations of performing a local planarization, in accordance with one embodiment of the present invention.

FIG. 5 is a flowchart 500 of the method operations of performing a local planarization, in accordance with one embodiment of the present invention. In operation 505, the additional layer 202 is added on top of the conductive overburden portion 112. In operation 510, the first etch process is applied to remove the majority of the additional layer 202 and the conductive overburden portion 112. In operation 515, the second etch process is applied to remove the remaining overburden portion 112' to the endpoint.

In an alternative embodiment, operation 515 can also include a finish etch process as described above. Subsequent processes after the finish etch can include selective barrier removal and passivating the remaining conductive material 120 to prevent corrosion and provide stability for further processing. An additional operation after the finish etch process can be designed not to significantly remove any material but only passivate the remaining conductive material 120 to prevent corrosion and provide stability for further processing.

Figure 6A:
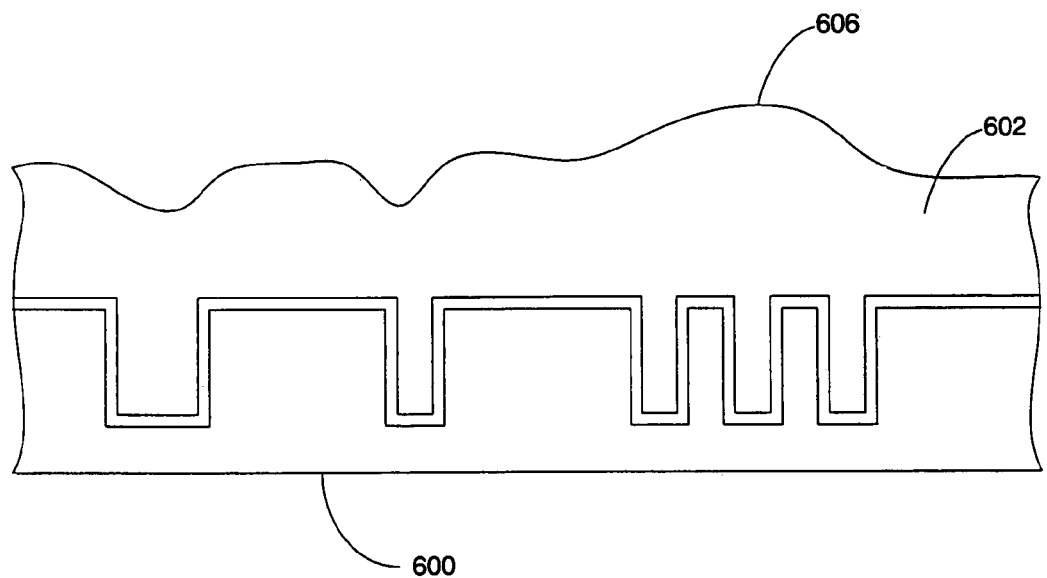
FIGS. 6A-6D show a sequence of chemical conversion and etch-back processes applied to a substrate to increase local uniformity, in accordance with one embodiment of the present invention.

FIGS. 6A-6D show a sequence of chemical conversion and etch-back processes applied to a substrate 600 to increase local uniformity, in accordance with one embodiment of the present invention. FIG. 7 is a flowchart 700 of the method operations of the chemical conversion and etch-back processes applied to a substrate 600 to increase local uniformity, in accordance with one embodiment of the present invention. As shown in FIG. 6A, the substrate 600 has a substantially non-planar overburden portion 602 with non-planar surface profile 606, similar to the substrate 100 described in FIG. 1 above.

Figure 6B:
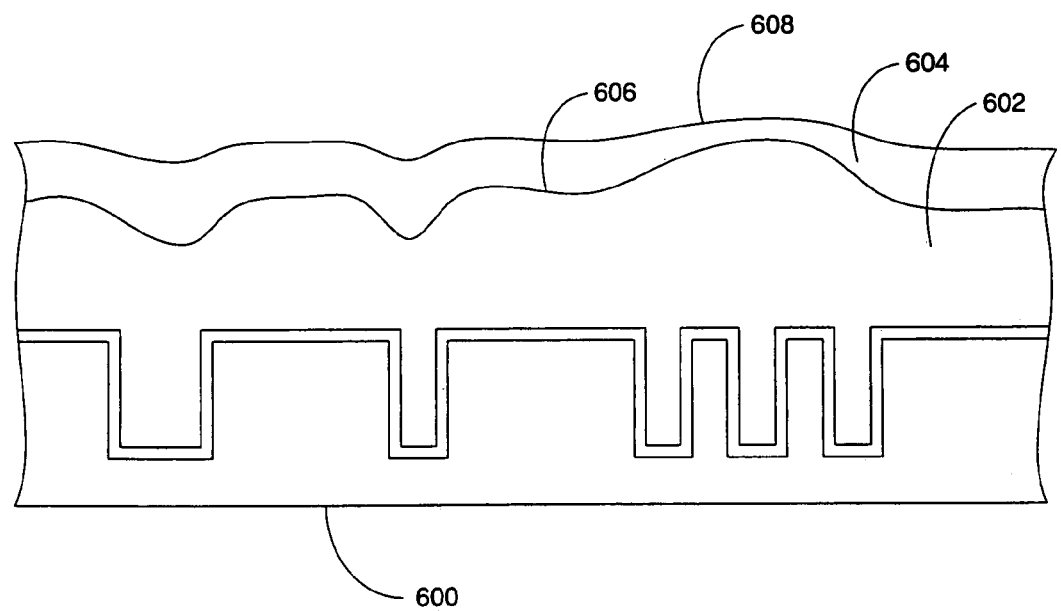
Figure 7:
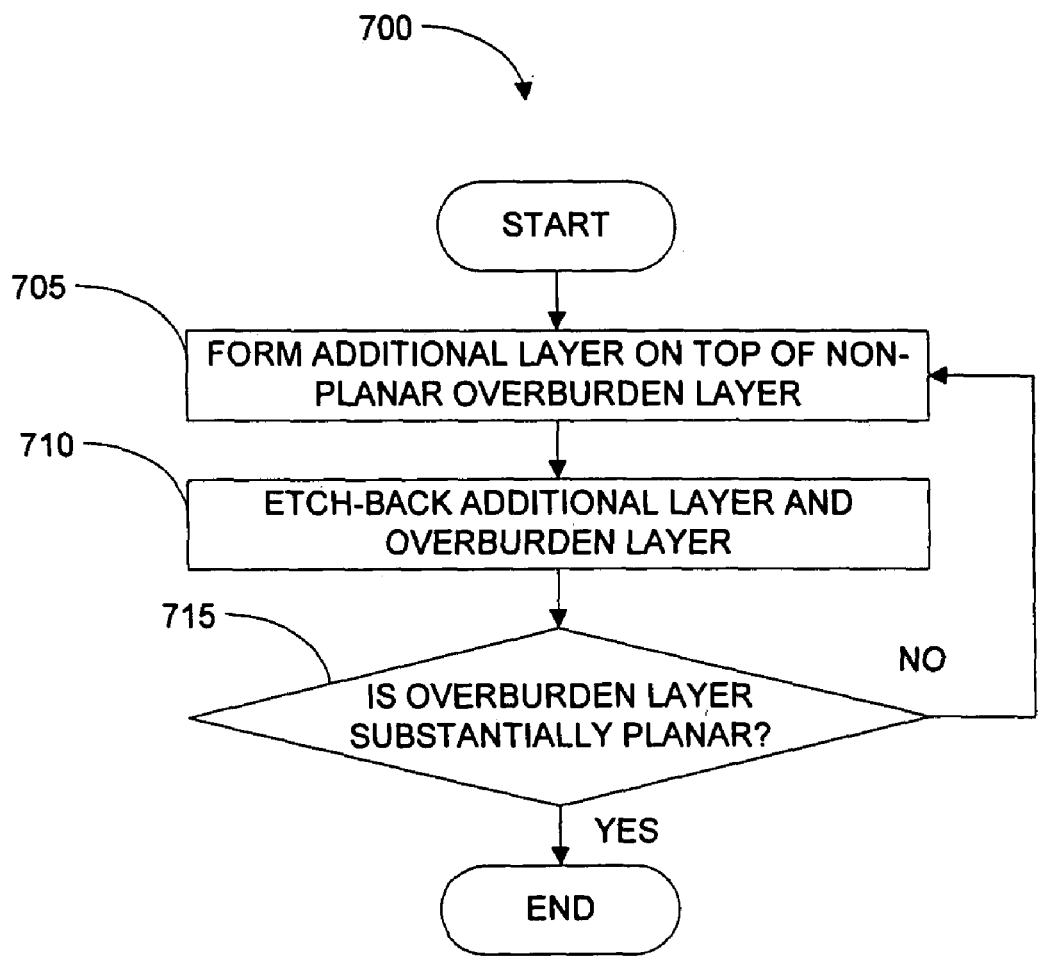
FIG. 7 is a flowchart of the method operations of the chemical conversion and etch-back processes applied to a substrate to increase local uniformity, in accordance with one embodiment of the present invention.

Referring now to FIGS. 6B and 7, in operation 705, an additional layer 604 is formed on top of the overburden portion 602. The additional layer 604 may be deposited or formed on the overburden portion 602. By way of example, the additional layer 604 can be formed through a chemical conversion of a top-most portion of the overburden portion 602. If the overburden portion 602 is copper or copper alloy, then a controlled exposure to a gas can form a copper reaction product layer 604. One example is a halogen gas that can form a Cu-halide layer 604. The copper reactant layer 604 diffuses into the surface of the copper overburden 602 to convert a top portion of the copper overburden 602. Processes for chemical conversion of copper are known in the art, such as Nagraj S. Kulkarni and Robert T. DeHoff, "Application of Volatility Diagrams for Low Temperature, Dry Etching, and Planarization of Copper", Journal of Electrochemical Society, 149 (11) G620-G632, 2002.

In another example, the additional layer 604 can be deposited on the overburden portion 602. The deposited layer 604 can include a polymer layer or an oxide layer being deposited on the overburden portion 602.

Figure 6C:
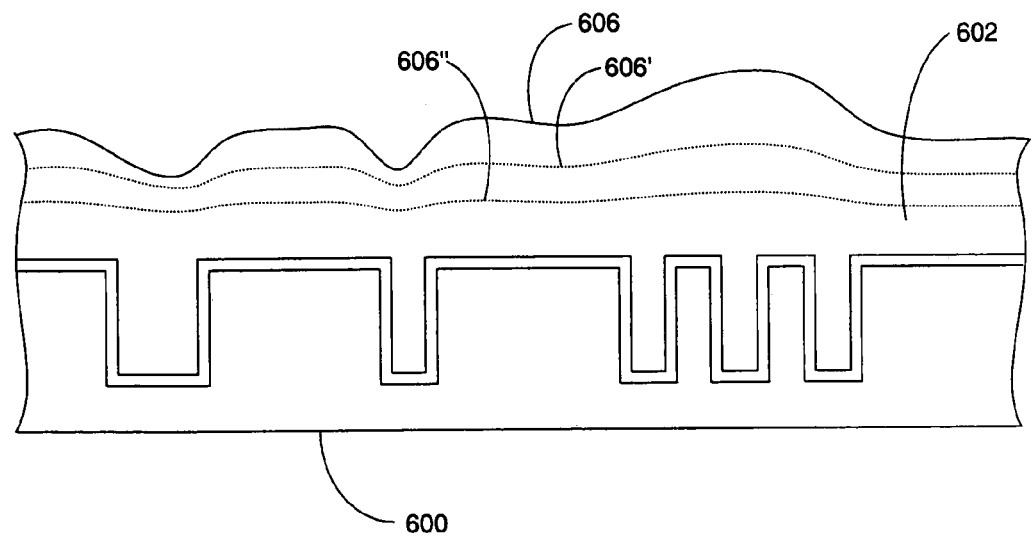
Figure 6D:
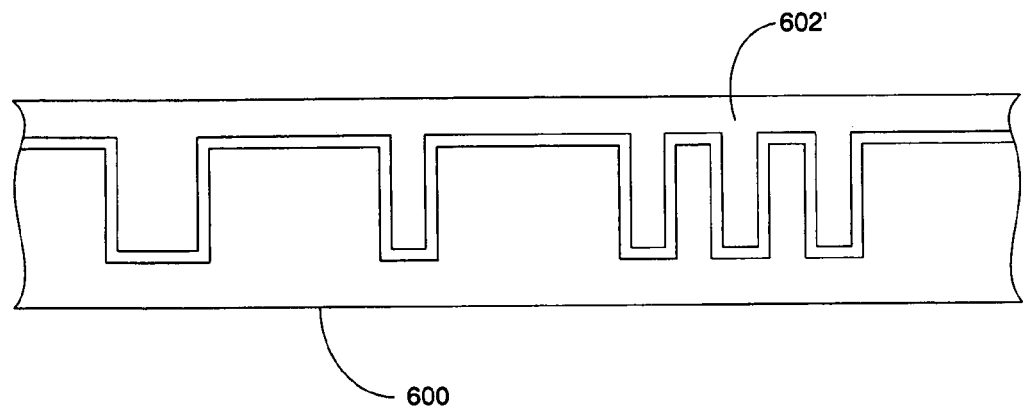

Referring now to operation 710 and FIG. 6C, an etch-back process is applied to remove the additional layer 604. A portion of the overburden portion 602 may also be removed. Removing the additional layer 604 results in further softening (i.e., planarizing) of the profile of the overburden portion 602 to profile 606'. The Cu-halide substantially softens the contours of the overburden portion 602. A Cu-halide can also maintain a substantially 1:1 etch-back selectivity with the copper overburden portion 602. Operations 705 and 710 can be repeated multiple times to substantially planarize the overburden portion 602 to subsequent profiles 606' and 606", as shown in FIG. 6D, until the resulting profile is substantially planar.

Chemical conversion of copper overburden portion 602 utilizing shape dependence of compound formation can be typically achieved by oxidizing the copper at the Cu-reactive species interface. Copper oxidization in this instance can include a chemical conversion of elemental copper to a copper compound with copper in a positive oxidation state. By way of example, oxidation of the copper to cuprous- or cupric chloride (CuCl or CuCl2) at the surface can occur in a chlorine plasma at lower temperatures (e.g., <200 degrees C.).

The etch-back process involves reduction of this copper compound to another chemical compound capable of being volatile and thus leaving the surface of the remaining overburden 602' at the fixed substrate temperature. By way of example, there can be a reduction of the CuCl2 to volatile Cu3Cl3 in the presence of reactive hydrogen species (e.g., H2 plasma). Alternating the shape-dependent conversion followed by etch-back of the converted portion can lead to bulk removal of the copper overburden portion 602, while simultaneously planarizing the topography (e.g., profile) of the copper overburden 602.

In operation 715, if the overburden portion 602 is substantially planarized, then the method operations end. Alternatively, if in operation 715, the overburden portion 602 is not substantially planarized, then the method operations continue at operation 705 above. In one embodiment, operations 705-715 can occur in situ within a single etch chamber. In an alternative embodiment, operation 710 can occur ex situ and can include ECP or low-down force CMP processes to achieve the substantially planar overburden portion 602' as shown in FIG. 6D.

The method operations described in FIGS. 6A-7 can be used as a planar bulk removal process that performs both planarization of the non-planar overburden portion 602 and removal of the bulk of the overburden portion 602.

The local planarization of the substrates 100, 600 can be determined through any one or more of several known layer thickness mapping technologies that are known in the art. By way of example, an eddy current sensor can map the thickness of the overburden portion 112, 112' as described in commonly owned U.S. patent application Ser. No. 10/328,912 entitled System, Method And Apparatus For Thin-Film Substrate Signal Separation Using Eddy Current by Gotkis et al., filed on Dec. 23, 2002 and U.S. patent application Ser. No. 10/251,033 entitled System And Method For Metal Residue Detection And Mapping Within A Multi-Step Sequence by Gotkis et al., filed on Sep. 19, 2002, which are incorporated by reference herein, in their entirety.

The methods and systems described in FIGS. 1-7 above describe various approaches to substantially eliminating local, pattern dependant non-uniformities in an overburden portion. However, methods and systems described in FIGS. 1-7 above do not directly address correction of global non-uniformities. Global non-uniformities can include variations in removal rates of material in the center of the substrate as compared to the edge of the substrate and other non-uniformities that are not localized phenomena.

Figure 8:
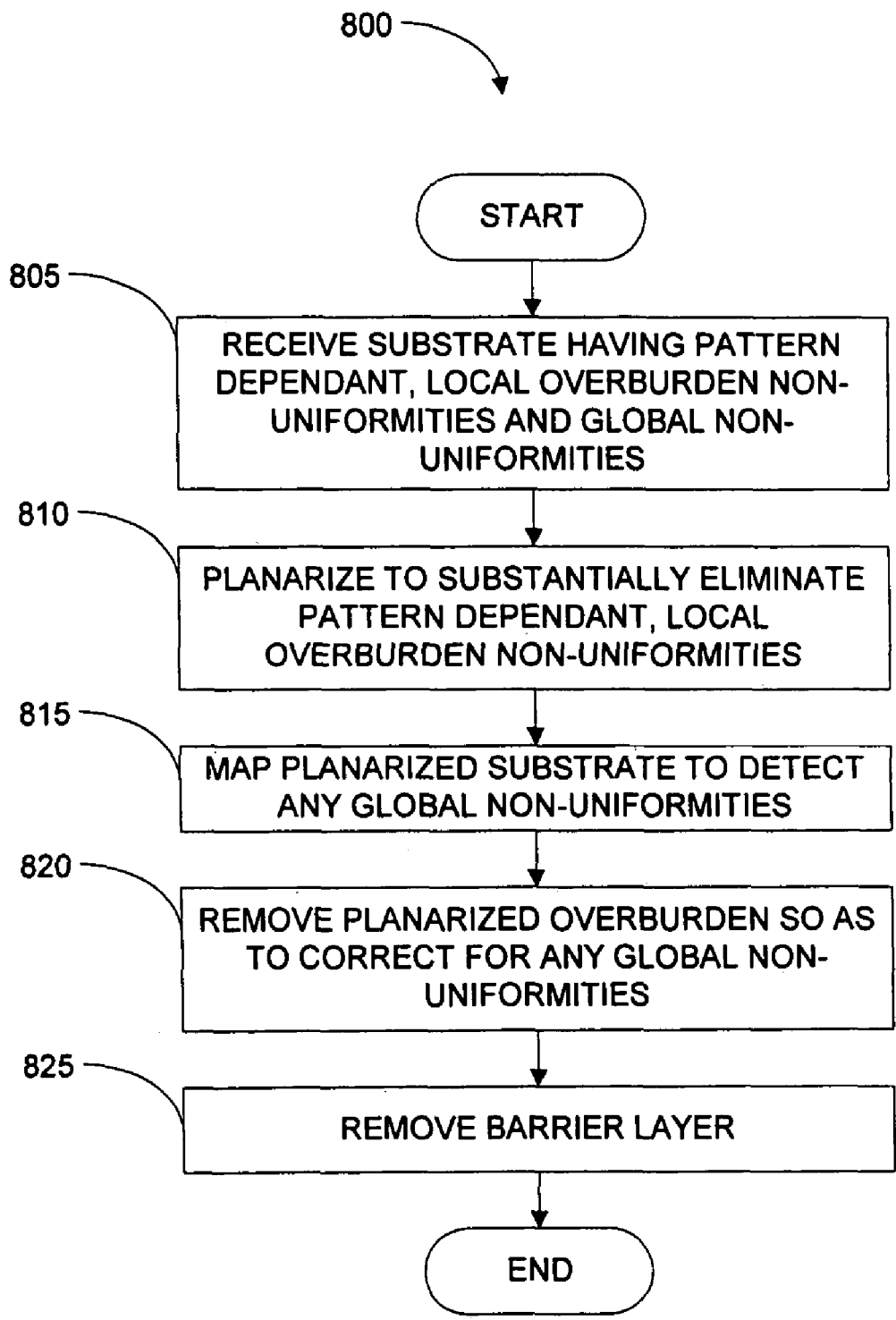
FIG. 8 is a flowchart of the method operation of correcting global non-uniformities in accordance with one embodiment of the present invention.

FIG. 8 is a flowchart of the method operation 800 of correcting global non-uniformities in accordance with one embodiment of the present invention. In operation 805, a substrate having localized non-uniformities such as feature-pattern dependant non-uniformities in the overburden portion is received. In operation 810, the localized non-uniformities are substantially eliminated such as through CMP, ECP or the methods and systems described in FIGS. 1-7 above or any other method known in the art. Substantially removing the localized non-uniformities forms a substantially, locally planarized overburden portion such as the planarized overburden portion 112' shown in FIG. 3 above.

Figure 9:
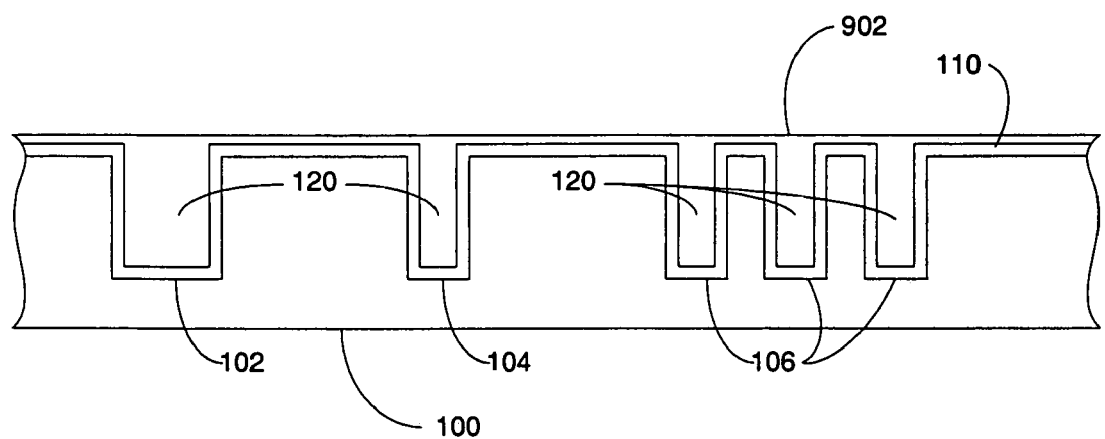
FIG. 9 shows a substantially removed, planarized overburden portion in accordance with one embodiment of the present invention.

FIG. 9 shows a substantially removed, planarized overburden portion 902 in accordance with one embodiment of the present invention. The substantially removed, planarized overburden portion 902 can be a relatively thin overburden portion such as a few hundred angstroms in thickness.

In operation 815, the substrate with the planarized overburden portion is mapped to identify and quantify any global non-uniformities in the planarized overburden portion. The planarized overburden portion can be mapped with any one or more of several known layer thickness mapping technologies that are known in the art as described above. The mapping can be in situ (within the current process chamber) or ex situ (external to the current process chamber). An in situ mapping process can also be dynamic and allow for the subsequent processes to be dynamically adjusted as the subsequent processes progress.

In operation 820, the location and quantity of the global non-uniformities, as determined in operation 815 above, are removed in a substantially mechanical stress-free process by adjusting an etching process to address the specific requirements of the detected global non-uniformities in a finish etch process. By way of example, if the remaining overburden portion 902 were approximately 500 angstroms thick in the center and 300 angstroms thick on the edge, then the recipe can be adjusted such that the center to edge non-uniformity can be compensated for so that the entire barrier layer 110 will be exposed simultaneously. The stress-free process avoids the CMP problems described above because no mechanical force is applied to the substrate during the etch-back process.

The recipe (e.g., selected values of process variables) that is selected is selective to barrier layer 110 (i.e., will etch the barrier at a much slower rate than the recipe will etch the copper, e.g., a typical selectivity range of copper etch over barrier etch in these processes is greater than about 1 but less than about 3) and that will minimize any recesses (e.g., excess removal of the conductive material 120 in the features 102, 104, 106).

The finish etch can have relatively slow etch rates for both copper of the remaining overburden portion 902 and the barrier layer 110 to minimize any recess into the features 102, 104, 106 with respect to the remaining height barrier of the barrier layer 110. As a result, the finish etch cannot have a very high selectivity to etch the copper.

A final etch-back process can also be included. The final etch-back process includes etch-back of the mask material and/or the ILD material with appropriate selectivity and uniformity control such that the final outcome provides substantially globally uniform and substantially planar features with minimal copper and ILD loss (e.g., any copper recess is globally uniform across the substrate at the end of the final etch and barrier removal processes). In this instance, the final etch would include a uniform process to etch-back the mask material with high selectivity to minimize copper loss and minimize the copper recess. By way of example, a halogen-based process where the halogen concentration is low and the substrate temperature is low (e.g., less than about 200 degrees C.) will maintain a low copper etch rate while still sufficiently chemically etching the mask material. Any plasma feed gas including halogen reactive species (e.g., CF4, C2F6, C4F6) can be used. Etch rate control additives can include Ar, O2, CH2F2 and others can also be included.

If the global copper recess and/or mask/ILD loss are non-uniform across the substrate at the end of the finish etch and final etch-back process, then additional variations in the recipe must be taken to correct for the global non-uniformities. By way of example, typical instances are a result of etch non-uniformity are described as center fast or edge fast etch rates. In either of these instances, can result in a variation in copper recess and/or mask/ILD loss across the substrate. Compensation can be achieved to counter this variation to obtain globally planar features with minimal copper and mask loss utilizing appropriate uniformity and selectivity controls during the final etch-back of the mask/ILD material. In the instance of a center-fast finish etch process resulting in larger copper recess in the center of the substrate can be compensated for by an edge-fast final etch back process which selectively etches the mask material to bring to the same level as the copper level in the features 102, 104, 106. Typical selectivity obtained in this process is greater than about 2. Variations of the recipe to provide for uniformity control include pressure, temperature variation across substrate, ion flux uniformity controls, gas concentrations and chamber wall temperature. Variations to control selectivity include reactive halogen species concentration, substrate temperature, and bias power.

Figure 10:
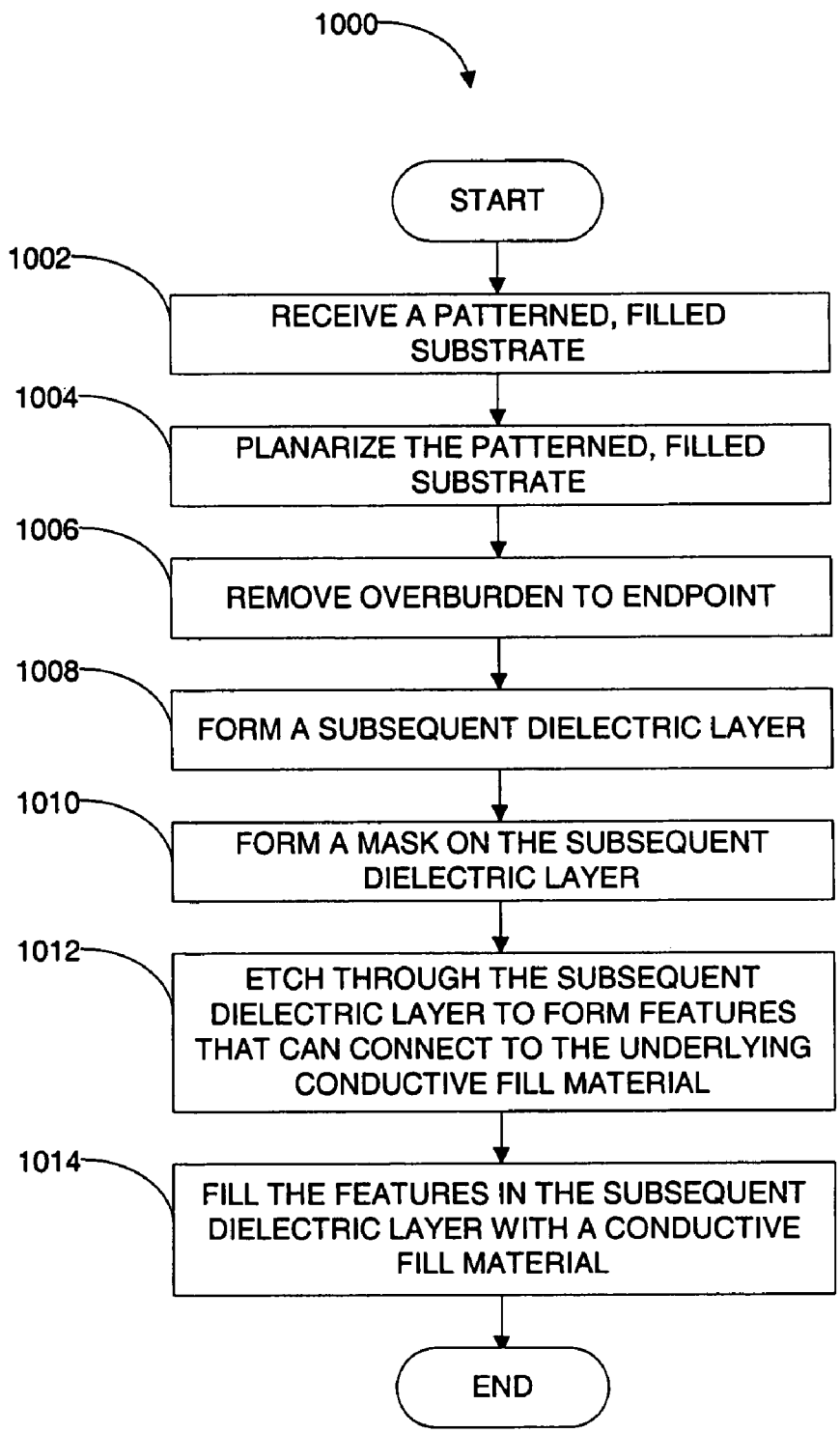
FIG. 10 is a flowchart of the method operations in accordance with one embodiment of the present invention.
Figure 11A:
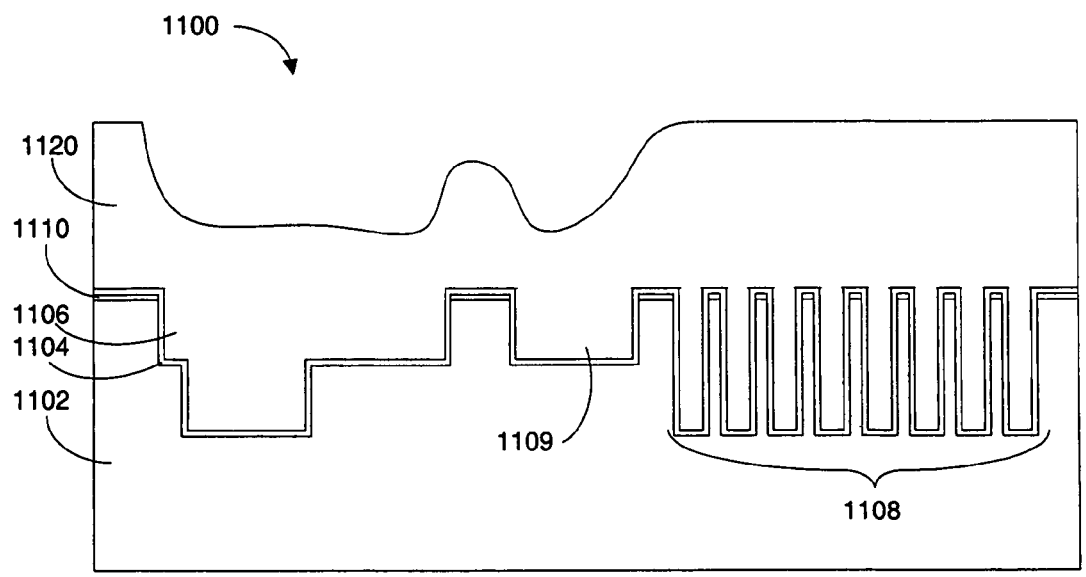
FIG. 11A shows the patterned and filled semiconductor substrate in a dual damascene process in accordance with one embodiment of the present invention.
Figure 11B:
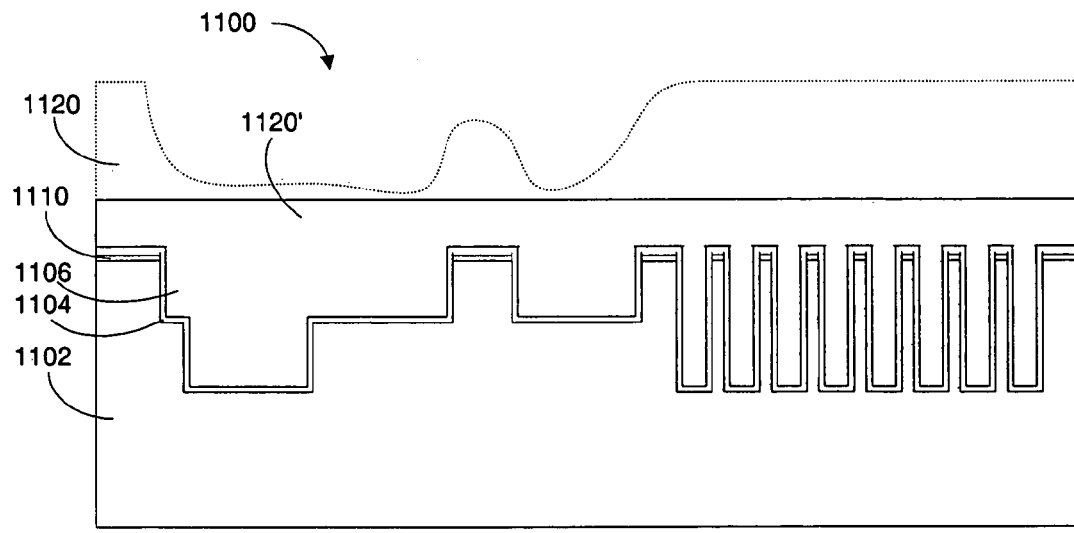
FIG. 11B shows the patterned, filled and planarized semiconductor substrate in a dual damascene process in accordance with one embodiment of the present invention.
Figure 11C:
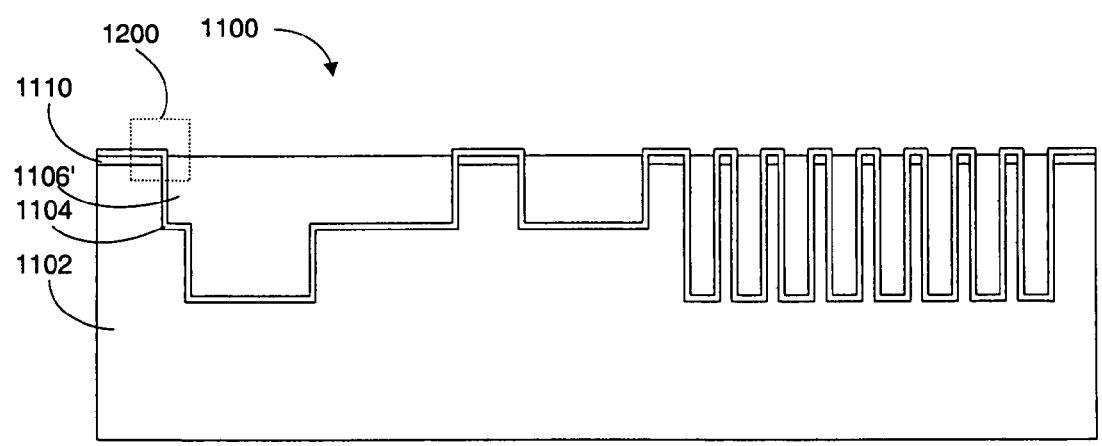
FIG. 11C shows the etched semiconductor substrate in a dual damascene process in accordance with one embodiment of the present invention.

FIGS. 10 through 11C describe the method operations of dual damascene processing in accordance with one embodiment of the present invention. FIG. 10 is a flowchart of the method operations 1000 in accordance with one embodiment of the present invention. In an operation 1002, a patterned and filled semiconductor substrate 1100 is provided. FIG. 11A shows the patterned and filled semiconductor substrate 1100 in a dual damascene process in accordance with one embodiment of the present invention. The underlying substrate layer 1102 includes an exemplary large feature 1106, an exemplary medium feature 1109 and multiple exemplary small features 1108. The substrate layer 1102 can include a low-k dielectric material.

A liner layer 1104 (e.g., tantalum, tantalum nitride, tantalum nitride stacks, ruthenium, tungsten, platinum, iridium, Ti-silicon nitride, etc.) is formed inside each of the features 1106, 1108 and 1109. A mask layer 1110 is also included. The mask layer 1110 is typically an oxide, carbide or nitride layer used for masking purposes in a previous etch patterning operation. The present invention is also applicable if the mask layer is considered as identical to the dielectric substrate material. As will be described in more detail below, the mask layer 1110 can also be metallic and/or conductive material. The mask layer 1110 typically has a higher-K dielectric value (e.g., greater than about 3) than the other low-K dielectrics used within the semiconductor manufacturing processes. The mask layer 1110 is often formed on top of low-K dielectric layers for protection purposes (e.g., to protect the low-K materials from physical and chemical damage in subsequent processes). The mask layer 1110 can include multiple layers as will be described in more detail below.

Each of the features 1106, 1108 and 1109 are filled with a conductive fill material 1120 (e.g., copper, copper alloy or other conductive material). The conductive fill material 1120 has an uneven overburden portion formed above the features 1106, 1108 and 1109 similar to that described in FIG. 1 above.

In an operation 1004, the semiconductor substrate 1100 is planarized. FIG. 11B shows the patterned, filled and planarized semiconductor substrate 1100 in a dual damascene process in accordance with one embodiment of the present invention. The uneven overburden portion of conductive fill material 1120 has been substantially removed in a bulk removal and planarizing process such as described in FIGS. 1 through 9 above. A CMP process (e.g., a low down force CMP process) can also be used to remove the bulk of the overburden portion of the conductive fill material 1120 and planarize the conductive fill material 1120. A minimum quantity of the substantially planar overburden portion of the conductive fill material 1120' remains after the bulk removal and planarizing process.

In an operation 1006, the remaining conductive fill material 1120' and the liner layer 1104 are removed to a desired endpoint (e.g., so that substantially all of the material desired to be removed has been removed). This operation can be accomplished by one or more steps as previously described above. FIG. 11C shows the etched semiconductor substrate 1100 in a dual damascene process in accordance with one embodiment of the present invention. The endpoint of interest for this portion of the etch is typically where a top surface of the mask layer 1110 is exposed and the top surface of the conductive material 1120' is even with or slightly dished relative to the top surface of the mask layer. The etch process and chemistry can be selective to the mask 1110 so that the mask is not substantially removed while the conductive fill material 1120' is removed. As a result, the remaining conductive material 1120' will be etched away until the mask layer 1110 is substantially uncovered.

In typical prior art semiconductor manufacturing processes operation 1006 is performed with a CMP process and the mask layer 1110 is used as a CMP stop layer. As a result, the typical mask layer 1110 is required to be thicker than about 1000 angstroms or more. The mask layer 1110 is needed as a CMP stop layer because the CMP processes cannot typically achieve a selectivity of about 10:1 the liner layer 1104 to the substrate dielectric layer 1102. Therefore, in typical CMP operations, the liner layer 1104 and conductive fill material 1120' are often removed below the top surface of the mask layer 1110, forming an undesirable trench or rounded edge transition between the mask layer and the conductive material 1120'. Further, the typical CMP operations can cause undesirable pitting, local non-uniformities and delamination of the various layers of material. Delamination can occur due to the shearing forces imparted to the semiconductor substrate 1100 by the typical CMP process. However a relatively low-down force CMP, for example with down force less than about 5 psi does not impart significant shearing forces to the semiconductor substrate 1102 during conductive fill material removal. Transitions between low-k materials and other materials can be especially vulnerable to delamination due to the relatively low adhesion characteristics of many low-k materials.

However, etch processes, such as are described herein, can achieve an etch selectivity of about 10:1 the liner layer 1104 to the mask layer 1110 without imparting shearing stresses to the semiconductor substrate 1102. Etch processes can thereby more accurately etch the liner layer relative to the mask layer. In this manner the removal (i.e., etching) of the liner layer 1104 can be more accurately controlled and a sharper edge transition between the mask layer 1110 and the conductive material 1120' can be achieved. Further, since the mask layer 1110 is no longer required to be used as a CMP stop layer, then the mask layer can be much thinner (i.e., less than about 250 angstroms) or eliminated altogether. Further still, additional materials can be used instead of the traditional CMP stop materials. By way of example, the mask layer 1110 can include layer(s) of lower k organosilicate glass materials containing different ratios of silicon carbon oxygen and hydrogen (SiCOH) or polymer based dielectrics with or without silicon such as crosslinked polyphenylene polymer, methyl-silsesquionoxane, hydrogen-silsesquionoxane as well as the many porous versions of these films. The requirement for such a mask/cap layer 1110 and its exact thickness will depend on the damascene patterning scheme, lithography and pattern etch process conditions. This invention enables much thinner films to be used in all cases compared to CMP as described above.

Figure 11D:
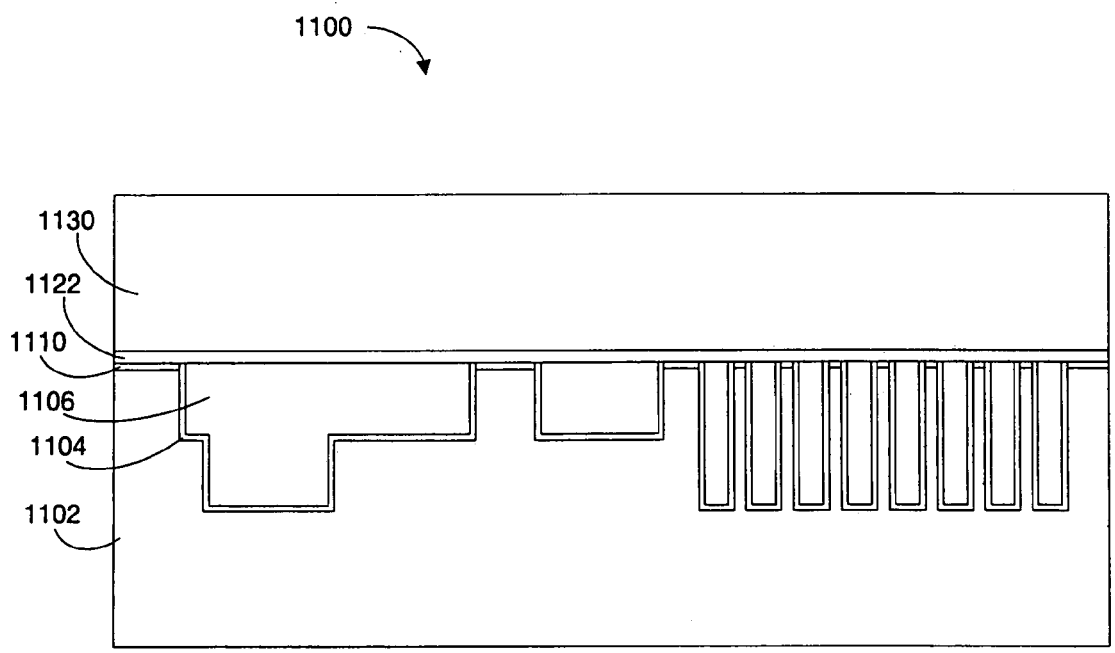
FIG. 11D shows the semiconductor substrate with the subsequent dielectric layer, in accordance with one embodiment of the present invention.

In an operation 1008 a subsequent dielectric layer is formed on top of the etched semiconductor substrate 1100. FIG. 11D shows the semiconductor substrate 1100 with the subsequent dielectric layer 1130, in accordance with one embodiment of the present invention. The subsequent dielectric layer 1130 can include one or more barrier layers 1122. The subsequent dielectric layer 1130 can include a low-k dielectric material. The subsequent dielectric layer 1130 can also be planarized as described in FIGS. 13 and 14A-C below.

Figure 11E:
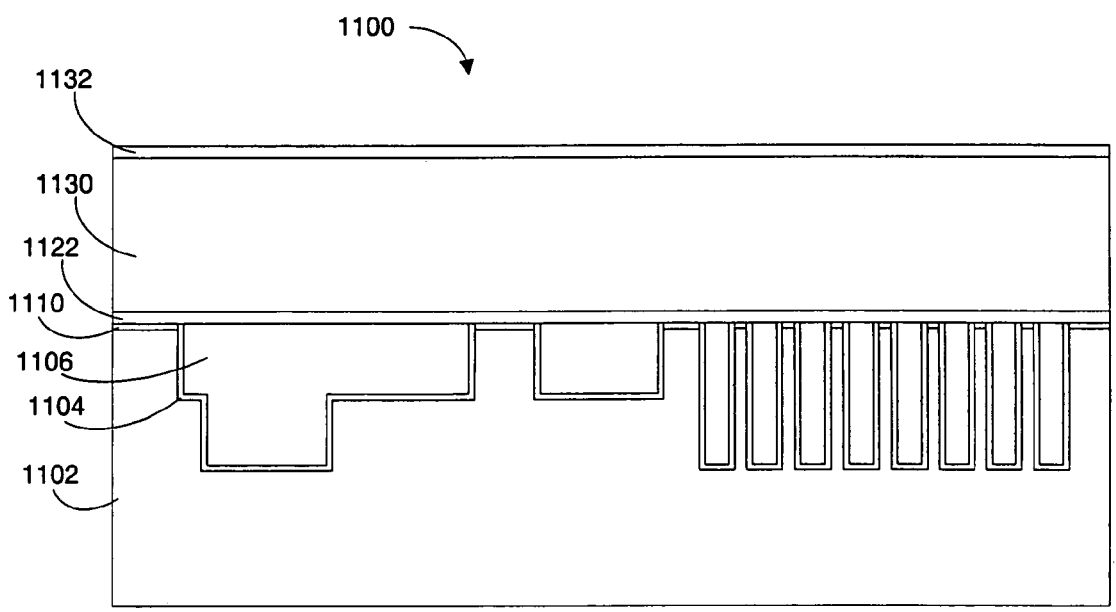
FIG. 11E shows the semiconductor substrate with the mask layer formed on top of the subsequent dielectric layer, in accordance with one embodiment of the present invention.

In an operation 1010, a mask layer 1132 is formed on top of the subsequent dielectric layer 1130 as shown in FIG. 11E. FIG. 11E shows the semiconductor substrate 1100 with the mask layer 1132 formed on top of the subsequent dielectric layer 1130, in accordance with one embodiment of the present invention. The mask layer 1130 allows the dielectric layer 1130 to be patterned for subsequent device formation processes.

Figure 11F:
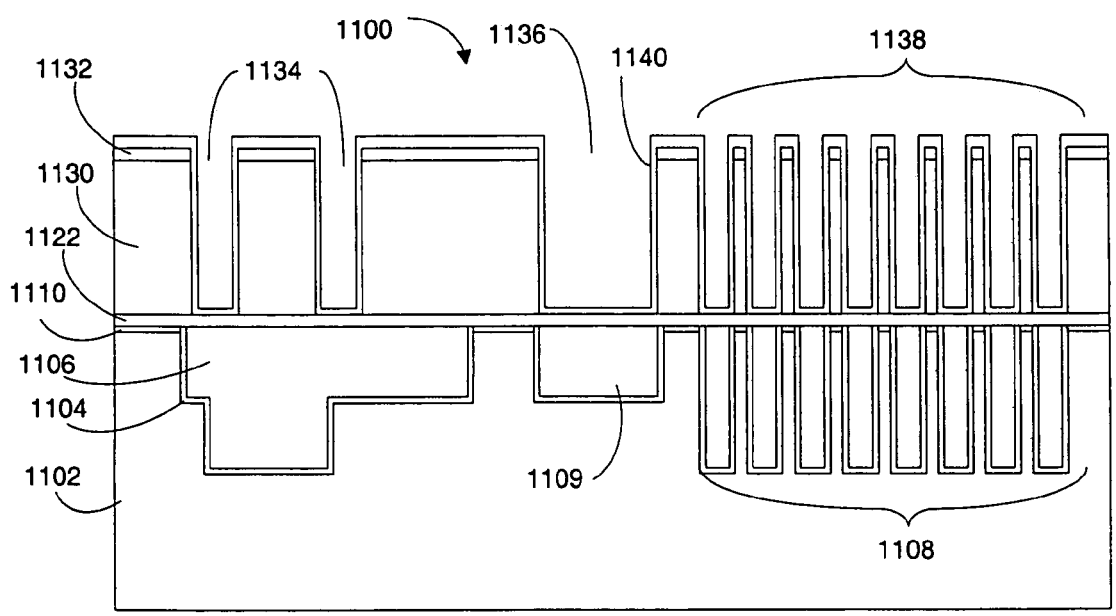
FIG. 11F shows the semiconductor substrate with the features formed in the dielectric layer, in accordance with one embodiment of the present invention.

In an operation 1012, the dielectric layer 1130 is etched to form features 1134, 1136 and 1138. FIG. 11F shows the semiconductor substrate 1100 with the features 1134, 1136 and 1138 formed in the dielectric layer 1130, in accordance with one embodiment of the present invention. The features 1134, 1136 and 1138 can interconnect with the underlying conductive fill material 1120' in the underlying features 1106, 1108 and 1109 as shown above.

In an operation 1014, the features 1134, 1136 and 1138 can also be filled with a conductive fill material. Filling the features 1134, 1136 and 1138 with the conductive fill material can also include applying an appropriate liner layer 1140 to the interior surfaces of the features. The method operations can then end or the method operations can continue as described in operation 1002 above.

Figure 11G:
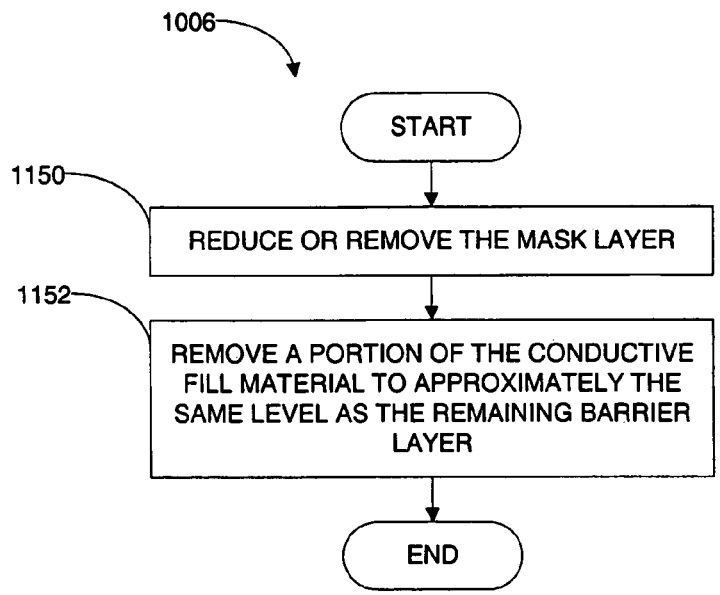
FIG. 11G is a flowchart of the method operations for removing the remaining conductive fill material to the desired endpoint, in accordance with one embodiment of the present invention.

Referring now to FIGS. 11G and 12A through 12D for a more detailed description of the removal to endpoint process described in operation 1006 of FIG. 10 above. FIG. 11G is a flowchart of the method operations 1006 for removing the remaining conductive fill material 1120' to the desired endpoint, in accordance with one embodiment of the present invention. FIGS. 12A through 12D show detailed views of the region 1200 of the mask layer 1110 and the conductive material 1120', in various embodiments of the removal to endpoint process.

Figure 12A:
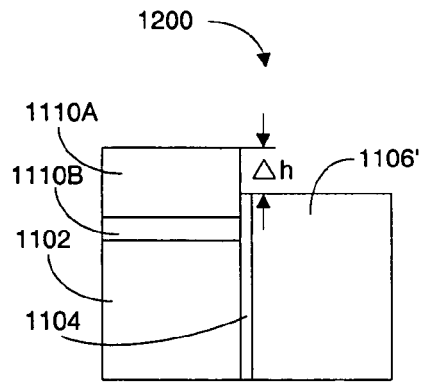
FIGS. 12A through 12D show detailed views of the region of the mask layer and the conductive material, in various embodiments of the removal to endpoint process.
Figure 12B:
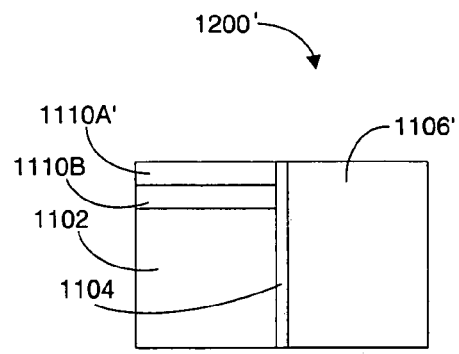

As shown in FIGS. 12A and 12B, the mask layer 1110 includes multiple layers 1110A and 1110B. As described above, in prior art CMP operations, the mask layer(s) 1110, 1110A, 1110B, as applicable, are typically left within the material stack. However, due to the higher K value of the mask layer(s) a minimum thickness of the mask layers is desired. FIG. 12A shows the conductive fill material 1120' and liner layer 1104 being slightly dished as compared to the top surface of the mask layer 1110A. The conductive fill material 1120' has a dishing depth of Δh below the top surface of the mask layer 1110A. Typically, the mask layers 1110A, 1110B have a total thickness of about 500 to about 1000 angstroms or more and a typical Δh has a range of between about 250 and 500 angstroms. Because the mask layers 1110A, 1110B are no longer required to be CMP stop layers, but can still be removed by etch processing much more flexibility is provided to the damascene chip designer and other materials can be used to perform other functions. By way of example, the top mask layer 1110A can still be the higher k nitride or oxide for their strength or chemical resistance properties. Nitride and oxide layers have good deposit and adhesion characteristics and can be easily and accurately etched. Or the mask can be a low-k material or omitted as described above.

FIG. 12A shows a detail of the region 1200 of the end point of the substrate 1100, in accordance with one embodiment of the present invention. FIG. 12B shows another detail of the region 1200 of the end point of the substrate 1100, in accordance with one embodiment of the present invention. Etching chemistries can be more accurately selective than CMP processes and therefore the top mask layer 1110A can be etched while the liner 1104 and the conductive material 1120' are not affected. As shown in FIG. 12B, the top mask layer 1110A can be etched until substantially even with the liner 1104 and the conductive material 1120' (i.e., the dishing depth Δh approaches zero). Alternatively a low down force CMP buff could also be used to remove at least a portion of the top mask layer 1110A. One advantage to this method is that since the top mask layer 1110A is at least partially removed, then the top mask layer can be much thicker (e.g., greater than about 1000 angstroms) than typically used without impacting the overall low-k characteristics of the material stack.

Figure 12C:
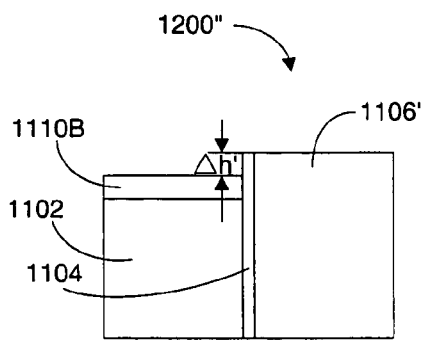

FIG. 12C shows another detail of the region 1200 of the end point of the substrate 1100, in accordance with one embodiment of the present invention. As shown in FIG. 12C, the top mask layer 1110A can be completely removed by an etch process chemistry that is selective to the underlying mask layer 1110B. The etch process can be a plasma etch or a wet etch process. Since the top mask layer 1110A is completely removed, the top surface of the remaining mask layer 1110B is slightly dished a depth of Δh' below the top Surface of the liner 1104 and the conductive material 1120'. The dishing depth Δh' can thereby be significantly less than Δh described in FIG. 12A above.

The stress-free etch processes described in FIGS. 1-9 above can remove the entire top mask layer 1110A, therefore the top mask layer can have an initial thickness of greater than 1000 angstroms or more. Further, since the top mask layer 1110A is fully removed, then a conductive material could be used for the top mask layer without shorting the various filled features 1106, 1108 and 1109 together. The underlying mask layer 1110B can be very thin (e.g. less than about 5 angstroms). The underlying mask layer 1110B can also be omitted (i.e., the underlying barrier layer can be the same material as the substrate 1102) and the etch process selective to the substrate material to fully remove the top mask layer 1110A to expose the underlying substrate material. Such a plasma etch process can be easily applied if the semiconductor substrate is already in a plasma etch chamber such as for the stress free bulk removal and planarization operations described in FIG. 10 above.

Figure 12D:
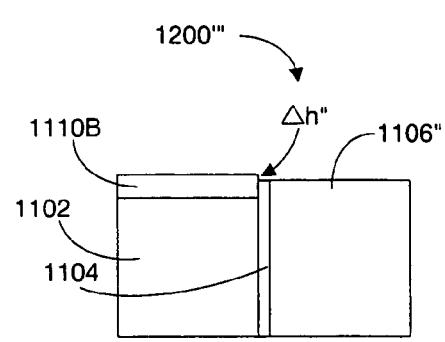

FIG. 12D shows yet another detail of the region 1200 of the end point of the substrate 1100, in accordance with one embodiment of the present invention. As shown in FIG. 12D the liner 1104 and conductive fill material 1120' are etched so that the dishing depth Δh" is significantly reduced as compared to Δh'. In this manner the dishing depth Δh" can be less than 250 angstroms.

Figure 13:
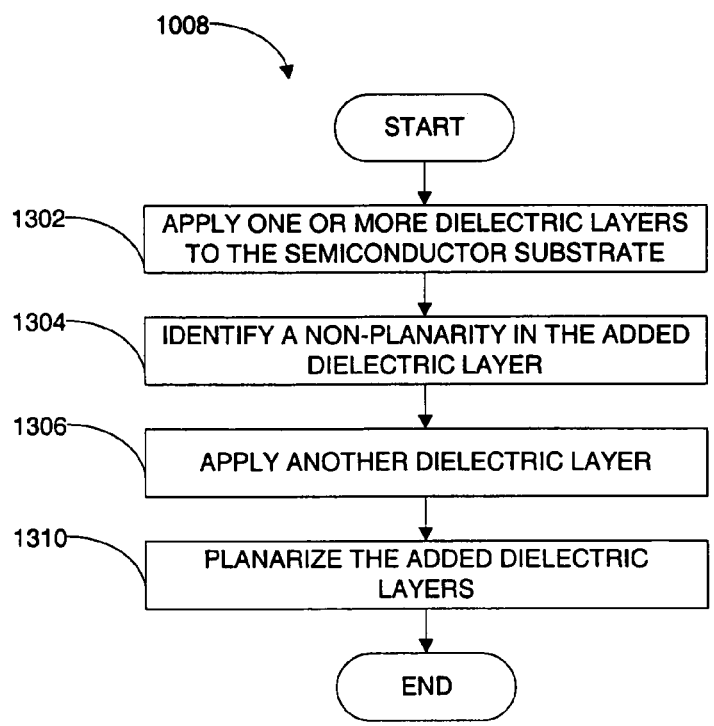
FIG. 13 is a flowchart of the method operations of applying the subsequent dielectric layer, in accordance with one embodiment of the present invention.
Figure 14A:
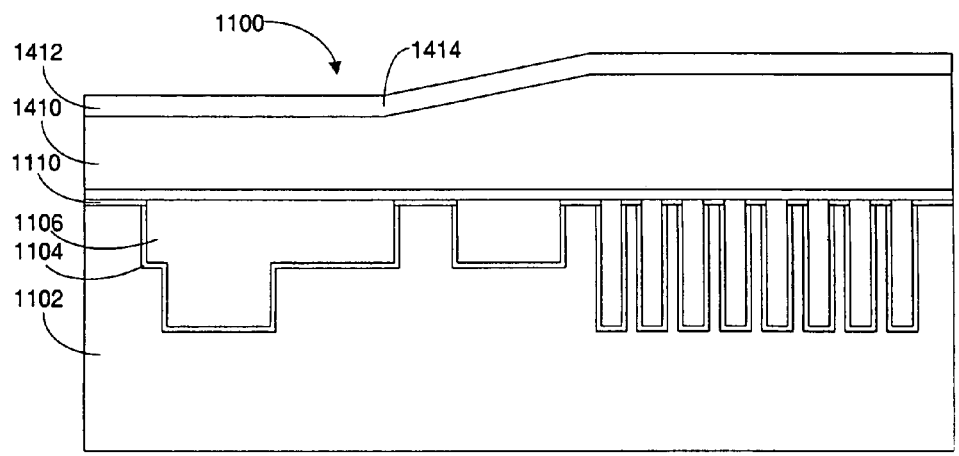
FIG. 14A shows multiple dielectric layers that make up the dielectric layer, in accordance with one embodiment if the present invention.

FIG. 13 is a flowchart of the method operations 1008 of applying the subsequent dielectric layer 1130, in accordance with one embodiment of the present invention. In an operation 1302, the dielectric layer 1130 is applied to the semiconductor substrate 1100. FIG. 14A shows multiple dielectric layers 1410, 1412 that make up the dielectric layer 1130, in accordance with one embodiment if the present invention.

In an operation 1304 one or more non-planarities 1414 are identified in the dielectric layer 1410, 1412. The planarity of the top dielectric layer 1412 can be critical for accurate lithographic operations (i.e., masking and subsequent etching) such as described in operation 1010 of FIG. 10 above. In a typical prior art process the total thickness of the dielectric layers 1410, 1412 must be relatively thin (e.g., less than about 1000 angstroms). However, as will be described in more detail below, the dielectric layers 1410, 1412 can have a total thickness of significantly more than about 1000 angstroms (e.g., about 4000 or more angstroms). By way of example, the dielectric layers 1410 and 1412 can be spin-on glass (SOG). As each layer is applied, the non-planarity 1414 can be reduced and substantially eliminated.

In another example, the first dielectric layer 1410 can be a low-k dielectric material while the second dielectric layer 1412 can be SOG or other substantially planar dielectric material. By way of example, SOG can reduce non-planarities about 50 percent for each layer of SOG.

Figure 14B:
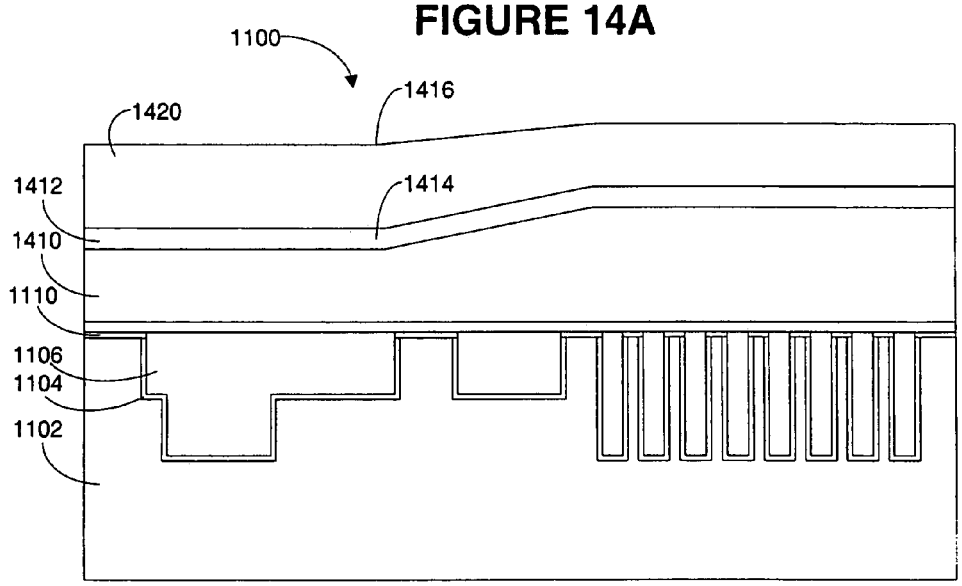
FIG. 14B shows a third dielectric layer on the semiconductor substrate, in accordance with one embodiment of the present invention.

In an operation 1306 another layer of dielectric layer is added to the semiconductor substrate 1100. FIG. 14B shows a third dielectric layer 1420 on the semiconductor substrate 1100, in accordance with one embodiment of the present invention. The third dielectric layer 1420 (or further subsequent dielectric layers) can be added to further reduce the non-planarity 1414. As shown the non-planarity 1416 is substantially less than the non-planarity 1414.

Figure 14C:
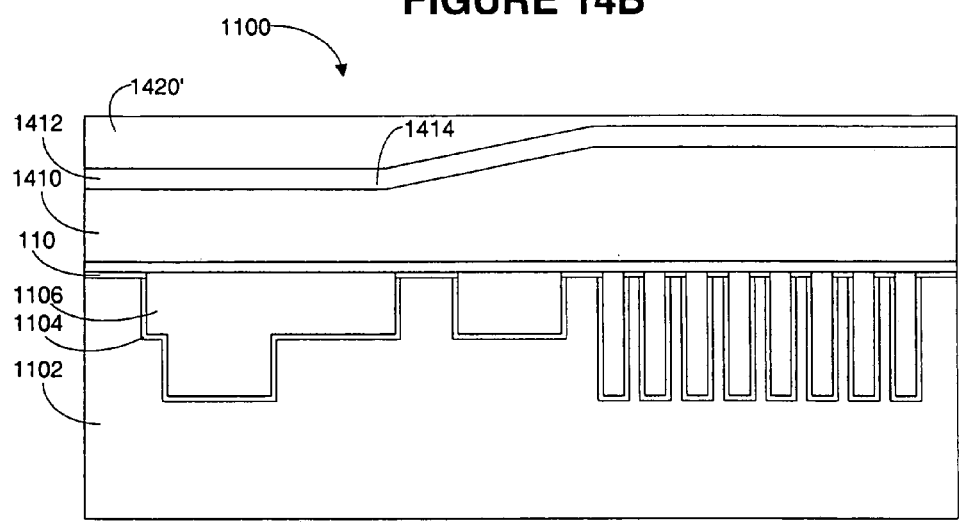
FIG. 14C shows a planarized third dielectric layer, in accordance with one embodiment of the present invention.

In an operation 1310, the dielectric layers 1410, 1412 and 1420 can be planarized. FIG. 14C shows a planarized third dielectric layer 1420, in accordance with one embodiment of the present invention. A planar portion of the third dielectric layer 1420' remains after the planarization operation. The planarization operation can be any type of suitable planarization process (e.g., CMP, low-down force CMP, stress free planarization, etc.).

It will be further appreciated that the instructions represented by the operations in any of the above figures are not required to be performed in the order illustrated, and that all the processing represented by the operations may not be necessary to practice the invention. Further, the processes described in any of the above figures can also be implemented in software stored in any one of or combinations of the RAM, the ROM, or the hard disk drive.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A method for forming a semiconductor in a dual damascene structure comprising:
   receiving a patterned semiconductor substrate, having a first conductive interconnect material filling a plurality of features in the pattern, the first conductive interconnect material having an non-planar overburden portion;
   planarizing the non-planar overburden portion without imparting mechanical force or imparting shearing stress to the plurality of features including:
      forming an additional layer on top of the non-planar overburden portion, the additional layer having a 1:1 etch selectivity with the non-planar overburden portion, wherein the additional layer is formed through a chemical conversion of a top-most portion of the overburden portion; and
      etching the additional layer and the overburden layer to soften a profile of the overburden portion and reduce the non-planarity of the overburden portion, wherein the etching is a chemical non-contact etch;
   forming a subsequent dielectric layer on the planarized overburden portion;
   planarizing the subsequent dielectric layer including:
      identifying a non-planarity in the subsequent dielectric layer;
      forming one or more additional dielectric layers over the subsequent dielectric layer; and
      planarizing at least one of the additional dielectric layers;
   forming a mask on the planar subsequent dielectric layer;
   forming one or more features in the planar subsequent dielectric layer; and
   filling the one or more features with a second conductive interconnect material.

2. The method of claim 1, wherein each one of the one or more additional dielectric layers have a thickness of less than about 1000 angstroms.

3. The method of claim 1, wherein at least one of the one or more additional dielectric layers is a spin-on-glass layer.

4. The method of claim 1, wherein at least one of the one or more additional dielectric layers is a low-k dielectric material layer.

5. The method of claim 1, wherein the one or more additional dielectric layers include at least one of a spin-on-glass layer and at least one of a low-k dielectric material layer.

6. The method of claim 1, wherein the subsequent dielectric layer has a total thickness of about 4000 angstroms.

7. The method of claim 1, wherein the at least one additional dielectric layers is a substantially planar material.

8. The method of claim 1, wherein the additional layer formed on top of the non-planar overburden portion is less non-planar than the non-planar overburden portion.

9. The method of claim 1, wherein planarizing at least one of the additional dielectric layers includes applying a stress free planarization.

10. A method for forming a semiconductor in a dual damascene structure comprising:
   receiving a patterned semiconductor substrate, having a first conductive interconnect material filling a plurality of features in the pattern, the first conductive interconnect material having an non-planar overburden portion;
   planarizing the non-planar overburden portion without imparting mechanical force or imparting shearing stress to the plurality of features, a remaining planar overburden portion having a thickness of between about zero and about 500 angstroms including:
      forming an additional layer on top of the non-planar overburden portion, the additional layer having a 1:1 etch selectivity with the non-planar overburden portion, wherein the additional layer is formed through a chemical conversion of a top-most portion of the overburden portion; and
      etching the additional layer and the overburden layer to soften a profile of the overburden portion and reduce the non-planarity of the overburden portion, wherein the etching is a chemical non-contact etch;

forming a subsequent dielectric layers on the planarized overburden portion;

planarizing the subsequent dielectric layer including:
    identifying a non-planarity in the subsequent dielectric layer;
    forming at least one additional dielectric layer over the subsequent dielectric layer, each one of the one or more additional dielectric layers having a thickness of less than about 1000 angstroms and wherein the one or more additional dielectric layers has a total thickness of between about 1000 and about 4000 angstroms; and
    planarizing at least one of the additional dielectric layers;

forming a mask on the planar subsequent dielectric layer;

forming one or more features in the planar subsequent dielectric layer; and filling the one or more features with a second conductive interconnect material.

11. The method of claim 10, wherein at least one of the one or more additional dielectric layers is a spin-on-glass layer.

12. The method of claim 10, wherein at least one of the one or more additional dielectric layers is a low-k dielectric material layer.

13. The method of claim 10, wherein the one or more additional dielectric layers include at least one of a spin-on-glass layer and at least one of a low-k dielectric material layer.

* * * * *